United States Patent
Van De Ven et al.

(10) Patent No.: US 7,213,940 B1
(45) Date of Patent: May 8, 2007

(54) LIGHTING DEVICE AND LIGHTING METHOD

(75) Inventors: Antony Paul Van De Ven, Hong Hong (HK); Gerald H. Negley, Durham, NC (US)

(73) Assignee: LED Lighting Fixtures, Inc., Morrisville, NC (US)

( * ) Notice: Subject to any disclaimer, the term of this patent is extended or adjusted under 35 U.S.C. 154(b) by 0 days.

(21) Appl. No.: 11/566,440

(22) Filed: Dec. 4, 2006

Related U.S. Application Data

(60) Provisional application No. 60/752,555, filed on Dec. 21, 2005, provisional application No. 60/752,556, filed on Dec. 21, 2005, provisional application No. 60/792,859, filed on Apr. 18, 2006, provisional application No. 60/793,524, filed on Apr. 20, 2006, provisional application No. 60/793,530, filed on Apr. 20, 2006, provisional application No. 60/792,860, filed on Apr. 18, 2006, provisional application No. 60/793,518, filed on Apr. 20, 2006, provisional application No. 60/857,305, filed on Nov. 7, 2006, provisional application No. 60/839,453, filed on Aug. 23, 2006, provisional application No. 60/868,134, filed on Dec. 1, 2006.

(51) Int. Cl.
*F21V 9/00* (2006.01)

(52) U.S. Cl. .................. 362/231; 362/545; 257/89; 257/98; 313/485; 315/307

(58) Field of Classification Search ............ 257/89, 257/98; 313/483, 485, 487; 362/84, 231, 362/260, 545, 612, 800; 315/185 S, 200 A, 315/322–324, 291, 312, 307; 345/82, 83, 345/102
See application file for complete search history.

(56) References Cited

U.S. PATENT DOCUMENTS 6,234,648 B1    5/2001    Börner et al.

(Continued)

FOREIGN PATENT DOCUMENTS

JP    2004-356116    12/2004

(Continued)

OTHER PUBLICATIONS

"Cree® XLamp® 7090 XR-E Series LED Binning and Labeling", CLD-AP08.000, Copyright © 2006 Cree, Inc. 4600 Silicon Drive, Durham, NC 27703, www.cree.com/xlamp, pp. 1-7.

*Primary Examiner*—Stephen F Husar
(74) *Attorney, Agent, or Firm*—Burr & Brown

(57) ABSTRACT

A lighting device comprising first and second groups of solid state light emitters, which emit light having dominant wavelength in ranges of from 430 nm to 480 nm and from 600 nm to 630 nm, respectively, and a first group of lumiphors which emit light having dominant wavelength in the range of from 555 nm to 585 nm. If current is supplied to a power line, a combination of (1) light exiting the lighting device which was emitted by the first group of emitters, and (2) light exiting the lighting device which was emitted by the first group of lumiphors would, in an absence of any additional light, produce a sub-mixture of light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38). Also provided is a method of lighting.

20 Claims, 9 Drawing Sheets

U.S. PATENT DOCUMENTS

Figure 1:
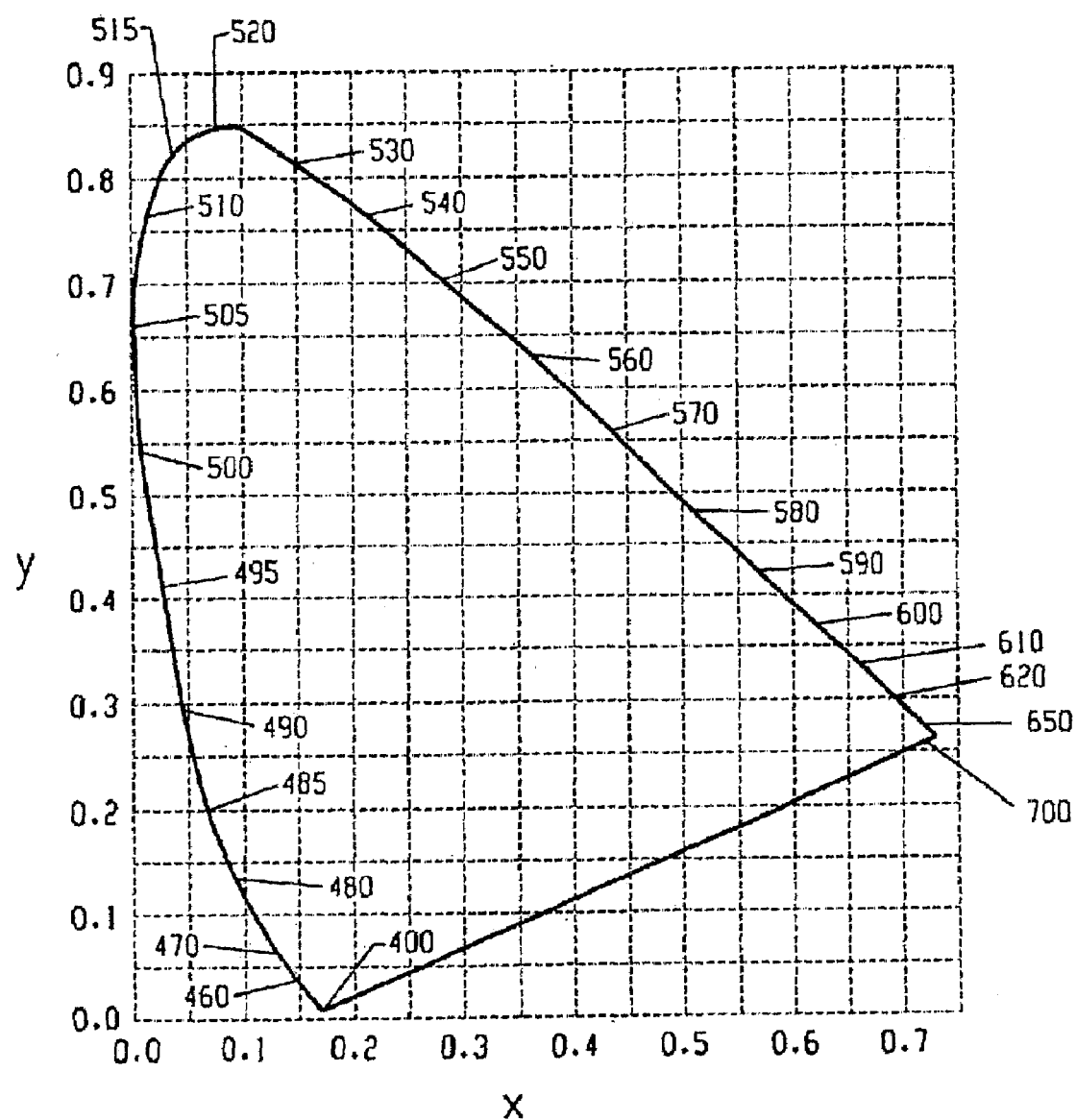

| | | |
|---|---|---|
| 6,441,558 B1 * | 8/2002 | Muthu et al. ............... 315/291 |
| 6,513,949 B1 | 2/2003 | Marshall et al. |
| 6,538,371 B1 | 3/2003 | Duggal et al. |
| 6,552,495 B1 | 4/2003 | Chang |
| 6,577,073 B2 | 6/2003 | Shimizu et al. |
| 6,692,136 B2 | 2/2004 | Marshall et al. |
| 6,784,463 B2 | 8/2004 | Camras et al. |
| 6,841,804 B1 | 1/2005 | Chen et al. |
| 6,914,267 B2 | 7/2005 | Fukasawa et al. |
| 6,936,857 B2 | 8/2005 | Doxsee et al. |
| 7,005,679 B2 | 2/2006 | Tarsa et al. |
| 7,008,078 B2 | 3/2006 | Shimizu et al. |
| 7,014,336 B1 | 3/2006 | Ducharme et al. |
| 7,066,623 B2 | 6/2006 | Lee et al. |
| 7,095,056 B2 | 8/2006 | Vitta et al. |
| 2003/0030063 A1 | 2/2003 | Sosniak et al. |
| 2004/0105261 A1 | 6/2004 | Ducharme et al. |
| 2005/0082974 A1 | 4/2005 | Fukasawa et al. |
| 2006/0012989 A1 | 1/2006 | Lee |
| 2006/0105482 A1 | 5/2006 | Alferink et al. |

FOREIGN PATENT DOCUMENTS

| | | |
|---|---|---|
| JP | 2005-142311 | 6/2005 |
| WO | 2005/124877 | 12/2005 |

* cited by examiner

LIGHTING DEVICE AND LIGHTING METHOD

CROSS-REFERENCE TO RELATED APPLICATIONS

This application claims the benefit of U.S. Provisional Patent Application No. 60/752,555, filed Dec. 21, 2005, entitled "Lighting Device and Lighting Method" (inventors: Antony Paul van de Ven and Gerald H. Negley), the entirety of which is hereby incorporated by reference.

This application claims the benefit of U.S. Provisional Patent Application No. 60/752,556, filed on Dec. 21, 2005, entitled "SIGN AND METHOD FOR LIGHTING" (inventors: Gerald H. Negley and Antony Paul van de Ven), the entirety of which is hereby incorporated by reference.

This application claims the benefit of U.S. Provisional Patent Application No. 60/792,859, filed on Apr. 18, 2006, entitled "LIGHTING DEVICE AND LIGHTING METHOD" (inventors: Gerald H. Negley and Antony Paul van de Ven), the entirety of which is hereby incorporated by reference.

This application claims the benefit of U.S. Provisional Patent Application No. 60/793,524, filed on Apr. 20, 2006, entitled "LIGHTING DEVICE AND LIGHTING METHOD" (inventors: Gerald H. Negley and Antony Paul van de Ven), the entirety of which is hereby incorporated by reference.

This application claims the benefit of U.S. Provisional Patent Application No. 60/792,860, filed on Apr. 18, 2006, entitled "LIGHTING DEVICE AND LIGHTING METHOD" (inventors: Gerald H. Negley and Antony Paul van de Ven), the entirety of which is hereby incorporated by reference.

This application claims the benefit of U.S. Provisional Patent Application No. 60/793,518, filed on Apr. 20, 2006, entitled "LIGHTING DEVICE AND LIGHTING METHOD" (inventors: Gerald H. Negley and Antony Paul van de Ven), the entirety of which is hereby incorporated by reference.

This application claims the benefit of U.S. Provisional Patent Application No. 60/793,530, filed on Apr. 20, 2006, entitled "LIGHTING DEVICE AND LIGHTING METHOD" (inventors: Gerald H. Negley and Antony Paul van de Ven), the entirety of which is hereby incorporated by reference.

This application claims the benefit of U.S. Provisional Patent Application No. 60/839,453, filed on Aug. 23, 2006, entitled "LIGHTING DEVICE AND LIGHTING METHOD" (inventors: Antony Paul van de Ven and Gerald H. Negley), the entirety of which is hereby incorporated by reference.

This application claims the benefit of U.S. Provisional Patent Application No. 60/857,305, filed on Nov. 7, 2006, entitled "LIGHTING DEVICE AND LIGHTING METHOD" (inventors: Antony Paul van de Ven and Gerald H. Negley), the entirety of which is hereby incorporated by reference.

This application claims the benefit of U.S. Provisional Patent Application No. 60/868,134, filed Dec. 1, 2006, entitled "Lighting Device and Lighting Method" (inventors: Antony Paul van de Ven and Gerald H. Negley), the entirety of which is hereby incorporated by reference.

FIELD OF THE INVENTION

The present invention relates to a lighting device, in particular, a device which includes one or more solid state light emitters (e.g., light emitting diodes) and one or more luminescent materials (e.g., one or more phosphors). The present invention is also directed to lighting methods.

BACKGROUND OF THE INVENTION

A large proportion (some estimates are as high as one third) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about four) but are still quite inefficient as compared to solid state light emitters, such as light emitting diodes.

In addition, as compared to the normal lifetimes of solid state light emitters, incandescent light bulbs have relatively short lifetimes, i.e., typically about 750–1000 hours. In comparison, the lifetime of light emitting diodes, for example, can generally be measured in decades. Fluorescent bulbs have longer lifetimes (e.g., 10,000–20,000 hours) than incandescent lights, but provide less favorable color reproduction.

Color reproduction is typically measured using the Color Rendering Index (CRI). CRI is a relative measurement of how the color rendition of an illumination system compares to that of a blackbody radiator, i.e., it is a relative measure of the shift in surface color of an object when lit by a particular lamp. The CRI equals 100 if the color coordinates of a set of test colors being illuminated by the illumination system are the same as the coordinates of the same test colors being irradiated by the blackbody radiator. Daylight has the highest CRI (of 100), with incandescent bulbs being relatively close (about 95), and fluorescent lighting being less accurate (70–85). Certain types of specialized lighting have relatively low CRI's (e.g., mercury vapor or sodium, both as low as about 40 or even lower). Sodium lights are used, e.g., to light highways. Driver response time, however, significantly decreases with lower CRI values (for any given brightness, legibility decreases with lower CRI).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used in place of incandescent lights, fluorescent lights and other light-generating devices in a wide variety of applications. In addition, where solid state light emitters are already being used, efforts are ongoing to provide solid state light emitter-containing devices which are improved, e.g., with respect to energy efficiency, color rendering index (CRI), contrast, efficacy (1 m/W), and/or duration of service.

Light emitting diodes are well-known semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present invention can employ any such devices. By way of example, Chapters 12–14 of Sze, Physics of Semiconductor Devices, (2d Ed. 1981) and Chapter 7 of Sze, Modern Semiconductor Device Physics (1998) describe a variety of photonic devices, including light emitting diodes.

The commonly recognized and commercially available light emitting diode ("LED") that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of solid state light emitters, e.g., light emitting diodes, has in many ways revolutionized the lighting industry, some of the characteristics of solid state light emitters have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI).

Because light that is perceived as white is necessarily a blend of light of two or more colors (or wavelengths), no single light emitting diode can produce white light. "White" light emitting diodes have been produced which have a light emitting diode pixel formed of respective red, green and blue light emitting diodes. Other "white" light emitting diodes have been produced which include (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

In general, the 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of colors.

A wide variety of luminescent materials (and structures which contain luminescent materials, known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear plastic encapsulant material (e.g., epoxy-based or silicone-based material) as discussed above, for example by a blending or coating process.

For example, U.S. Pat. No. 6,963,166 (Yano '166) discloses that a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. According to Yano '166, the first resin portion is obtained by filling the cup reflector with a resin material and curing it after the light emitting diode chip has been mounted onto the bottom of the cup reflector and then has had its cathode and anode electrodes electrically connected to the leads by way of wires. According to Yano '166, a phosphor is dispersed in the first resin portion so as to be excited with the light A that has been emitted from the light emitting diode chip, the excited phosphor produces fluorescence ("light B") that has a longer wavelength than the light A, a portion of the light A is transmitted through the first resin portion including the phosphor, and as a result, light C, as a mixture of the light A and light B, is used as illumination.

As noted above, "white LED lights" (i.e., lights which are perceived as being white or near-white) have been investigated as potential replacements for white incandescent lamps. A representative example of a white LED lamp includes a package of a blue light emitting diode chip, made of gallium nitride (GaN), coated with a phosphor such as YAG. In such an LED lamp, the blue light emitting diode chip produces a blue emission and the phosphor produces yellow fluorescence on receiving that emission. For instance, in some designs, white light emitting diodes are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light.

As also noted above, in another type of LED lamp, a light emitting diode chip that emits an ultraviolet ray is combined with phosphor materials that produce red (R), green (G) and blue (B) light rays. In such an "RGB LED lamp", the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

Designs have been provided in which existing LED component packages and other electronics are assembled into a fixture. In such designs, a packaged LED is mounted to a circuit board, the circuit board is mounted to a heat sink, and the heat sink is mounted to the fixture housing along with required drive electronics. In many cases, additional optics (secondary to the package parts) are also necessary.

In substituting solid state light emitters for other light sources, e.g., incandescent light bulbs, packaged LEDs have been used with conventional light fixtures, for example, fixtures which include a hollow lens and a base plate attached to the lens, the base plate having a conventional socket housing with one or more contacts which are electrically coupled to a power source. For example, LED light bulbs have been constructed which comprise an electrical circuit board, a plurality of packaged LEDs mounted to the circuit board, and a connection post attached to the circuit board and adapted to be connected to the socket housing of the light fixture, whereby the plurality of LEDs can be illuminated by the power source.

There is an ongoing need for ways to use solid state light emitters, e.g., light emitting diodes, to provide white light in a wider variety of applications, with greater energy efficiency, with improved color rendering index (CRI), with improved efficacy (1 m/W), and/or with longer duration of service.

BRIEF SUMMARY OF THE INVENTION

There exist "white" LED light sources which are relatively efficient but which have poor color rendering, typically having CRI values of less than 75, and which are particularity deficient in the rendering of red colors and also to a significant extent deficient in green. This means that many things, including the typical human complexion, food items, labeling, painting, posters, signs, apparel, home decoration, plants, flowers, automobiles, etc. exhibit odd or wrong color as compared to being illuminated with an incandescent light or natural daylight.

So called "warm white" LEDs have a more acceptable color temperature for indoor use, and good CRI, but their efficiency is much less then half that of the standard "white" LEDs.

Colored objects illuminated by RGB LED lamps frequently do not appear in their true colors. For example, an object that reflects only yellow light, and thus that appears to be yellow when illuminated with white light, will appear black when illuminated with light having an apparent yellow color, produced by the red and green LEDs of an RGB LED fixture. Such lamps, therefore, are considered to provide poor color rendition, particularly when illuminating various settings such as a theater stage, television set, building interior, or display window. In addition, currently available green LEDs are relatively inefficient, and thus limit the efficiency of such lamps.

Employing LEDs having a wide variety of hues would similarly necessitate use of LEDs having a variety of efficiencies, including some with low efficiency, thereby reducing the efficiency of such systems.

There is therefore a need for a high efficiency white light source that combines the efficiency and long life of white LEDs (i.e., which avoids the use of relatively inefficient light sources) with an acceptable color temperature and good color rendering index and a wide gamut.

In accordance with the present invention, it has unexpectedly been found that surprisingly high CRI can be obtained, while obtaining surprisingly high efficacy, by (1) illuminating one or more solid state light emitters which emit light having a dominant wavelength in the range of from 430 nm to 480 nm, (2) exciting one or more lumiphors which emit light having a dominant wavelength in the range of from 555 to 585 and (3) illuminating one or more solid state light emitters which emit light having a having a dominant wavelength in the range of from 600 nm to 630 nm such that:

a combination of light exiting the lighting device which was emitted by (1) the first group of solid state light emitters, (2) the first group of lumiphors, and (3) the second group of solid state light emitters produces a mixture of light having x, y coordinates on a 1931 CIE Chromaticity Diagram which define a point which is within ten MacAdam ellipses of at least one point on the blackbody locus on a 1931 CIE Chromaticity Diagram, and a combination of light exiting the lighting device which was emitted by (1) the first group of solid state light emitters, and (2) the first group of lumiphors would, in an absence of any additional light, produce a sub-mixture of light having x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

The expression "dominant wavelength", is used herein according to its well-known and accepted meaning to refer to the perceived color of a spectrum, i.e., the single wavelength of light which produces a color sensation most similar to the color sensation perceived from viewing light emitted by the light source (i.e., it is roughly akin to "hue"), as opposed to "peak wavelength", which is well-known to refer to the spectral line with the greatest power in the spectral power distribution of the light source. Because the human eye does not perceive all wavelengths equally (it perceives yellow and green better than red and blue), and because the light emitted by many solid state light emitter (e.g., LEDs) is actually a range of wavelengths, the color perceived (i.e., the dominant wavelength) is not necessarily equal to (and often differs from) the wavelength with the highest power (peak wavelength). A truly monochromatic light such as a laser has the same dominant and peak wavelengths.

Accordingly, in a first aspect of the present invention, there is provided a lighting device comprising:

a first group of solid state light emitters, the first group of solid state light emitters including at least one solid state light emitter;

a first group of lumiphors, the first group of lumiphors including at least one lumiphor;

a second group of solid state light emitters, the second group of solid state light emitters including at least one solid state light emitter; and at least a first power line, each of the first group of solid state light emitters and each of the second group of solid state light emitters being electrically connected to the first power line, wherein:

each of the first group of solid state light emitters, if illuminated, would emit light having a dominant wavelength in the range of from 430 nm to 480 nm;

each of the first group of lumiphors, if excited, would emit light having a dominant wavelength in the range of from about 555 nm to about 585 nm;

each of the second group of solid state light emitters, if illuminated, would emit light having a dominant wavelength in the range of from 600 nm to 630 nm;

if current is supplied to the first power line:

a combination of (1) light exiting the lighting device which was emitted by the first group of solid state light emitters, (2) light exiting the lighting device which was emitted by the first group of lumiphors, and (3) light exiting the lighting device which was emitted by the second group of solid state light emitters would, in an absence of any additional light, produce a mixture of light having x, y coordinates on a 1931 CIE Chromaticity Diagram which define a point which is within ten MacAdam ellipses of at least one point on the blackbody locus on a 1931 CIE Chromaticity Diagram, and a combination of (1) light exiting the lighting device which was emitted by the first group of solid state light emitters, and (2) light exiting the lighting device which was emitted by the first group of lumiphors would, in an absence of any additional light, produce a sub-mixture of light having x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to the first aspect of the present invention, the lighting device further comprises at least one switch electrically connected to the first power line, the switch selectively switching on and off current to the first power line.

In a second aspect of the present invention, there is provided a method of lighting comprising:

illuminating a first group of solid state light emitters, the first group of solid state light emitters including at least a first solid state light emitter, such that each of the first group of solid state light emitters emits light having a dominant wavelength in the range of from 430 nm to 480 nm;

illuminating a second group of solid state light emitters, the second group of solid state light emitters including at least one solid state light emitter, such that each of the second group of solid state light emitters emits light having a dominant wavelength in the range of from 600 nm to 630 nm exciting a first group of lumiphors, the first group of lumiphors including at least one lumiphor, such that each of the first group of lumiphors emits light having a dominant wavelength in the range of from about 555 nm to about 585 nm;

wherein:

a combination of (1) light exiting the lighting device which was emitted by the first group of solid state light emitters, (2) light exiting the lighting device which was emitted by the first group of lumiphors, and (3) light exiting the lighting device which was emitted by the second group of solid state light emitters produces a mixture of light having x, y coordinates on a 1931 CIE Chromaticity Diagram which define a point which is within ten MacAdam ellipses of at least one point on the blackbody locus on a 1931 CIE Chromaticity Diagram, and a combination of (1) light exiting the lighting device which was emitted by the first group of solid state light emitters, and (2) light exiting the lighting device which was emitted by the first group of lumiphors would, in an absence of any additional light, produce a sub-mixture of light having x, y color coordinates which define a point which is within a first area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to the present invention, if current is supplied to the first power line, substantially all of the light emitted by the lighting device is emitted by the first group of solid state light emitters, the first group of lumiphors and the second group of solid state light emitters.

In some embodiments according to the present invention, if current is supplied to the first power line, the intensity of light emitted by the first group of solid state light emitters, the first group of lumiphors and the second group of solid state light emitters is at least about 75 percent (in some embodiments at least about 85 percent, and in some embodiments at least about 90 percent, 95 percent) of the total intensity of light being emitted by the lighting device.

at least a first power line, each of the first group of solid state light emitters and each In some embodiments according to the present invention, e.g., where the one or more solid state light emitters in the second group of solid state light emitters emit light having dominant wavelength in the range of from about 615 nm to about 616 nm, the sub-mixture of light has x, y color coordinates which define a point which is within a first area on a 1931 CIE Chromaticity Diagram enclosed by first, second, third and fourth line segments, the first line segment connecting a first point to a second point, the second line segment connecting the second point to a third point, the third line segment connecting the third point to a fourth point, the fourth line segment connecting the fourth point to the first point, the first point having x, y coordinates of 0.376, 0.487, the second point having x, y coordinates of 0.407, 0.470, the third point having x, y coordinates of 0.359, 0.384, and the fourth point having x, y coordinates of 0.326, 0.391.

In some embodiments according to the present invention, e.g., where the one or more solid state light emitters in the second group of solid state light emitters emit light having dominant wavelength in the range of from about 615 nm to about 616 nm, the sub-mixture of light has x, y color coordinates on a 1931 CIE Chromaticity Diagram which define a point which is within a sub-area in which x is in the range of from about 0.373 to about 0.383 and y is in the range of from about 0.441 to about 0.451. In some such embodiments, the mixture of light (i.e., including light from the first group of solid state light emitters, light from the first group of lumiphors and light from the second group of solid state light emitters) has x, y color coordinates on a 1931 CIE Chromaticity Diagram which define a point which is within a sub-area in which x is in the range of from about 0.454 to about 0.464 and y is in the range of from about 0.407 to about 0.417.

In some embodiments according to the present invention, e.g., where the one or more solid state light emitters in the second group of solid state light emitters emit light having dominant wavelength in the range of from about 615 nm to about 616 nm, the sub-mixture of light has x, y color coordinates on a 1931 CIE Chromaticity Diagram which define a point which is within a sub-area in which x is in the range of from about 0.367 to about 0.377 and y is in the range of from about 0.431 to about 0.441. In some such embodiments, the mixture of light (i.e., including light from the first group of solid state light emitters, light from the first group of lumiphors and light from the second group of solid state light emitters) has x, y color coordinates on a 1931 CIE Chromaticity Diagram which define a point which is within a sub-area in which x is in the range of from about 0.443 to about 0.453 and y is in the range of from about 0.402 to about 0.412.

In some embodiments according to the present invention, e.g., where the one or more solid state light emitters in the second group of solid state light emitters emit light having dominant wavelength in the range of from about 615 nm to about 616 nm, the sub-mixture of light has x, y color coordinates on a 1931 CIE Chromaticity Diagram which define a point which is within a sub-area in which x is in the range of from about 0.363 to about 0.373 and y is in the range of from about 0.423 to about 0.433. In some such embodiments, the mixture of light (i.e., including light from the first group of solid state light emitters, light from the first group of lumiphors and light from the second group of solid state light emitters) has x, y color coordinates on a 1931 CIE Chromaticity Diagram which define a point which is within a sub-area in which x is in the range of from about 0.435 to about 0.445 and y is in the range of from about 0.398 to about 0.408.

In some embodiments according to the present invention, e.g., where the one or more solid state light emitters in the second group of solid state light emitters emit light having dominant wavelength in the range of from about 615 nm to about 616 nm, the sub-mixture of light has x, y color coordinates on a 1931 CIE Chromaticity Diagram which define a point which is within a sub-area in which x is in the range of from about 0.352 to about 0.362 and y is in the range of from about 0.403 to about 0.413. In some such embodiments, the mixture of light (i.e., including light from the first group of solid state light emitters, light from the first group of lumiphors and light from the second group of solid state light emitters) has x, y color coordinates on a 1931 CIE Chromaticity Diagram which define a point which is within a sub-area in which x is in the range of from about 0.406 to about 0.416 and y is in the range of from about 0.388 to about 0.398.

In some embodiments according to the present invention, the sub-mixture of light has x, y color coordinates which define a point which is within a second area on a 1931 CIE Chromaticity Diagram enclosed by first, second, third and fourth line segments, the first line segment connecting a first point to a second point, the second line segment connecting the second point to a third point, the third line segment connecting the third point to a fourth point, the fourth line segment connecting the fourth point to the first point, the first point having x, y coordinates of 0.32, 0.40, the second point having x, y coordinates of 0.36, 0.48, the third point having x, y coordinates of 0.41, 0.455, and the fourth point having x, y coordinates of 0.36, 0.38.

In some embodiments according to the present invention, if all of the solid state light emitters in the first group of solid state light emitters are illuminated, at least one of the lumiphors in the first group of lumiphors would be excited by light emitted from first group of solid state light emitters.

In some embodiments according to the present invention, if all of the solid state light emitters in the first group of solid state light emitters are illuminated, all of the lumiphor's in the first group of lumiphors would be excited by light emitted from the first group of solid state light emitters.

In some embodiments according to the present invention, at least one of the solid state light emitters in the first group of solid state light emitters is embedded within an encapsulant element in which at least one of the first group of lumiphors is also embedded.

In some embodiments according to the present invention, the mixture of light would have a CRI of at least 80, in some cases at least 83, in some case at least 85, in some cases at least 90, and in some cases at least 92.

In some embodiments according to the present invention, the lighting device has an efficacy of at least 25 lumens per watt, in some cases at least 50 lumens per watt, in some cases at least 60 lumens per watt, in some cases at least 70 lumens per watt, and in some cases at least 80 lumens per watt.

In some embodiments according to the present invention, the mixture of light would have x, y coordinates on a 1931 CIE Chromaticity Diagram which define a point which is within five MacAdam ellipses, in some cases within three MacAdam ellipses, of at least one point on the blackbody locus on a 1931 CIE Chromaticity Diagram In some embodiments according to the present invention:
  each of the first group of solid state light emitters, if illuminated, would emit light having a dominant wavelength in the range of from 440 nm to 480 nm (in some embodiments, in the range of from 440 nm to 470 nm);
  each of the first group of lumiphors, if excited, would emit light having a dominant wavelength in the range of from about 560 nm to about 580 nm (in some embodiments, in the range of from 565 nm to 575 nm); and/or
  each of the second group of solid state light emitters, if illuminated, would emit light having a dominant wavelength in the range of from 605 nm to 630 nm (in some embodiments, in the range of from 610 nm to 620 nm).

The present invention is further directed to an enclosure comprising an enclosed space and at least one lighting device as described herein, wherein if current is supplied to the first power line, the lighting device illuminates at least a portion of the enclosed space.

The present invention is further directed to a structure comprising a surface and at least one lighting device as described herein, wherein if current is supplied to the first power line, the lighting device would illuminate at least a portion of the surface.

The present invention is further directed to an illuminated area, comprising at least one item selected from among the group consisting of swimming pool, a room, a warehouse, an indicator, a road, a vehicle, a road sign, a billboard, a ship, a toy, an electronic device, a boat, an aircraft, a stadium, a tree, a window, a yard and a lamppost, having mounted therein or thereon at least one lighting device as described herein.

In some embodiments according to the present invention, the lighting device further comprises at least one additional white solid state light emitter, i.e., a device which emits light which is perceived as white or near white (e.g., a packaged LED which contains at least one light emitting diode chip and/or at least one lumiphor which, when illuminated and/or excited, emits a combination of light which is perceived as white or near white, such as a packaged LED which consists of a blue light emitting diode chip and a yellow lumiphor), in which the one or more additional white solid state light emitters each emit a combination of light which has x, y color coordinates which define a point which is outside the first area on a 1931 CIE Chromaticity Diagram enclosed by the first, second, third, fourth and fifth line segments as defined above.

In some embodiments according to the present invention, the sub-mixture of light is produced by a first sub-group of light emitting diodes, a first sub-group of lumiphors, a second sub-group of light emitting diodes and a second sub-group of lumiphors, wherein:

if each of the first sub-group of light emitting diodes is illuminated and each of the first sub-group of lumiphors is excited, a mixture of light emitted from the first sub-group of light emitting diodes and the first group of lumiphors would, in the absence of any additional light, have a first sub-group mixed illumination having x, y color coordinates which are within a first sub-group area on a 1931 CIE Chromaticity Diagram which is outside of the first area (defined above)(e.g., an area which is enclosed by first, second, third and fourth line segments, the first line segment connecting a first point to a second point, the second line segment connecting the second point to a third point, the third line segment connecting the third point to a fourth point, and the fourth line segment connecting the fourth point to the first point, the first point having x, y coordinates of 0.36, 0.48, the second point having x, y coordinates of 0.43, 0.45, the third point having x, y coordinates of 0.5125, 0.4866, and the fourth point having x, y coordinates of 0.4087, 0.5896);

if each of the second sub-group of light emitting diodes is illuminated and each of the second sub-group of lumiphors is excited, a mixture of light emitted from the second sub-group of light emitting diodes and the second sub-group of lumiphors would, in the absence of any additional light, have a second sub-group mixed illumination having x, y color coordinates which are within a second sub-group area on a 1931 CIE Chromaticity Diagram which is outside the first area (defined above) and outside the first sub-group area (e.g., an area which is enclosed by fifth, sixth, seventh and eighth line segments, the fifth line segment connecting a fifth point to a sixth point, the sixth line segment connecting the sixth point to a seventh point, the seventh line segment connecting the seventh point to an eighth point, and the eighth line segment connecting the eighth point to the fifth point, the fifth point having x, y coordinates of 0.32, 0.40, the sixth point having x, y coordinates of 0.36, 0.38, the seventh point having x, y coordinates of 0.25, 0.29, and the eighth point having x, y coordinates of 0.30, 0.26); and if each of the first sub-group of light emitting diodes and the second sub-group of light emitting diodes is illuminated and each of the first sub-group of lumiphors and the second sub-group of lumiphors is excited, a mixture of light emitted from the first sub-group of light emitting diodes, the second sub-group of light emitting diodes, the first sub-group of lumiphors and the second sub-group of lumiphors would, in the absence of any additional light, have a first group-second group mixed illumination having x, y color coordinates which are within the first area on a 1931 CIE Chromaticity Diagram (i.e., enclosed by ninth, tenth, eleventh, twelfth and thirteenth line segments, the ninth line segment connecting a ninth point to a tenth point, the tenth line segment connecting the tenth point to an eleventh point, the eleventh line segment connecting the eleventh point to a twelfth point, the twelfth line segment connecting the twelfth point to a thirteenth point, and the thirteenth line segment connecting the thirteenth point to the ninth point, the ninth point having x, y coordinates of 0.32, 0.40, the tenth point having x, y coordinates of 0.36, 0.48, the eleventh point having x, y coordinates of 0.43, 0.45, the twelfth point having x, y coordinates of 0.42, 0.42, and the thirteenth point having x, y coordinates of 0.36, 0.38).

A variety of such lighting devices are disclosed in U.S. Patent Application No. 60/857,305 (unofficial), filed on Nov. 7, 2006, entitled "LIGHTING DEVICE AND LIGHTING METHOD" (inventors: Antony Paul van de Ven and Gerald H. Negley, the entirety of which is hereby incorporated by reference.

In some embodiments according to the second aspect of the present invention, the first and second groups of solid state light emitters are illuminated by supplying current to the first power line.

The solid state light emitters can be saturated or non-saturated. The term "saturated", as used herein, means having a purity of at least 85%, the term "purity" having a well-known meaning to persons skilled in the art, and procedures for calculating purity being well-known to those of skill in the art.

Figure 2:
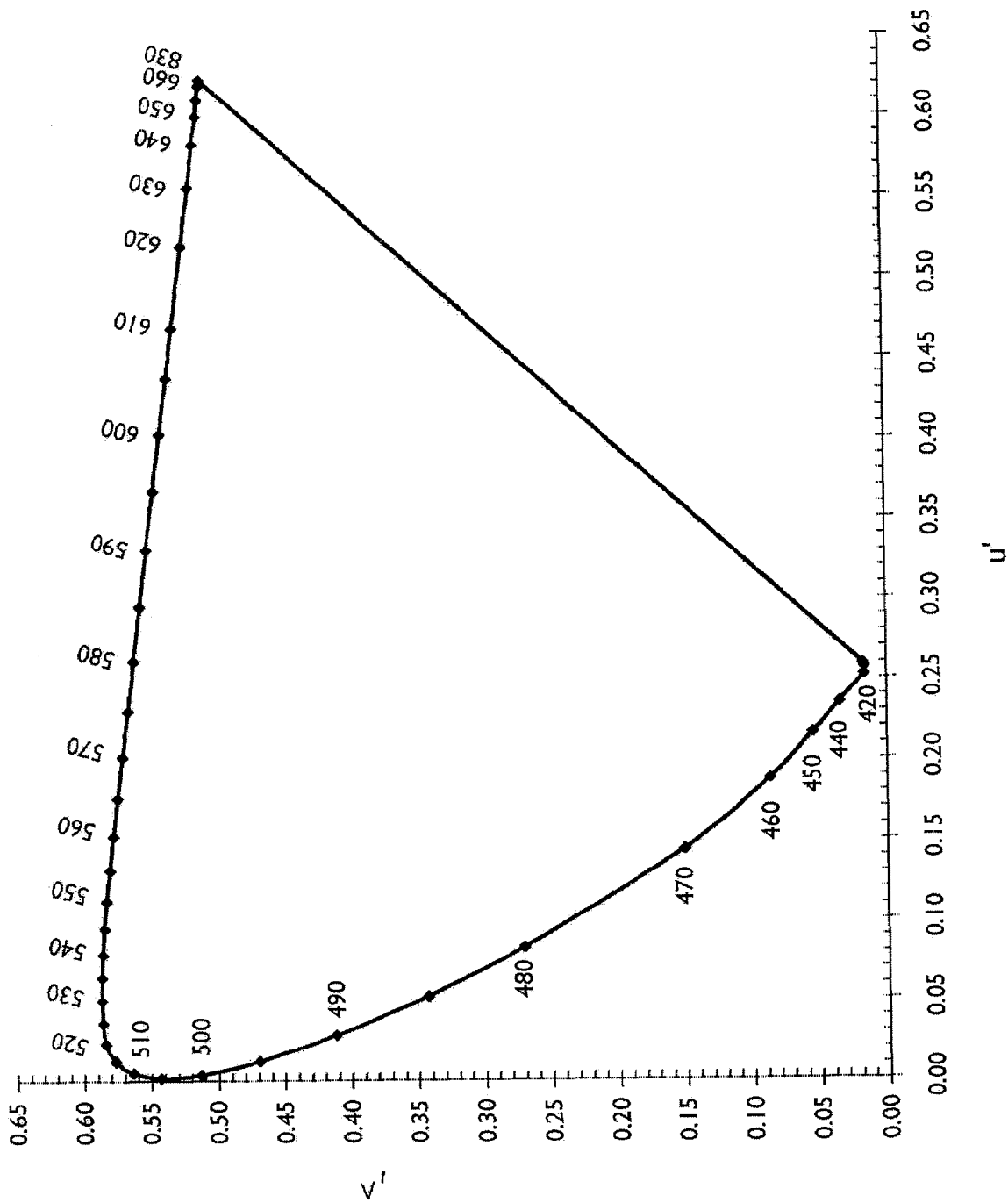
Figure 3:
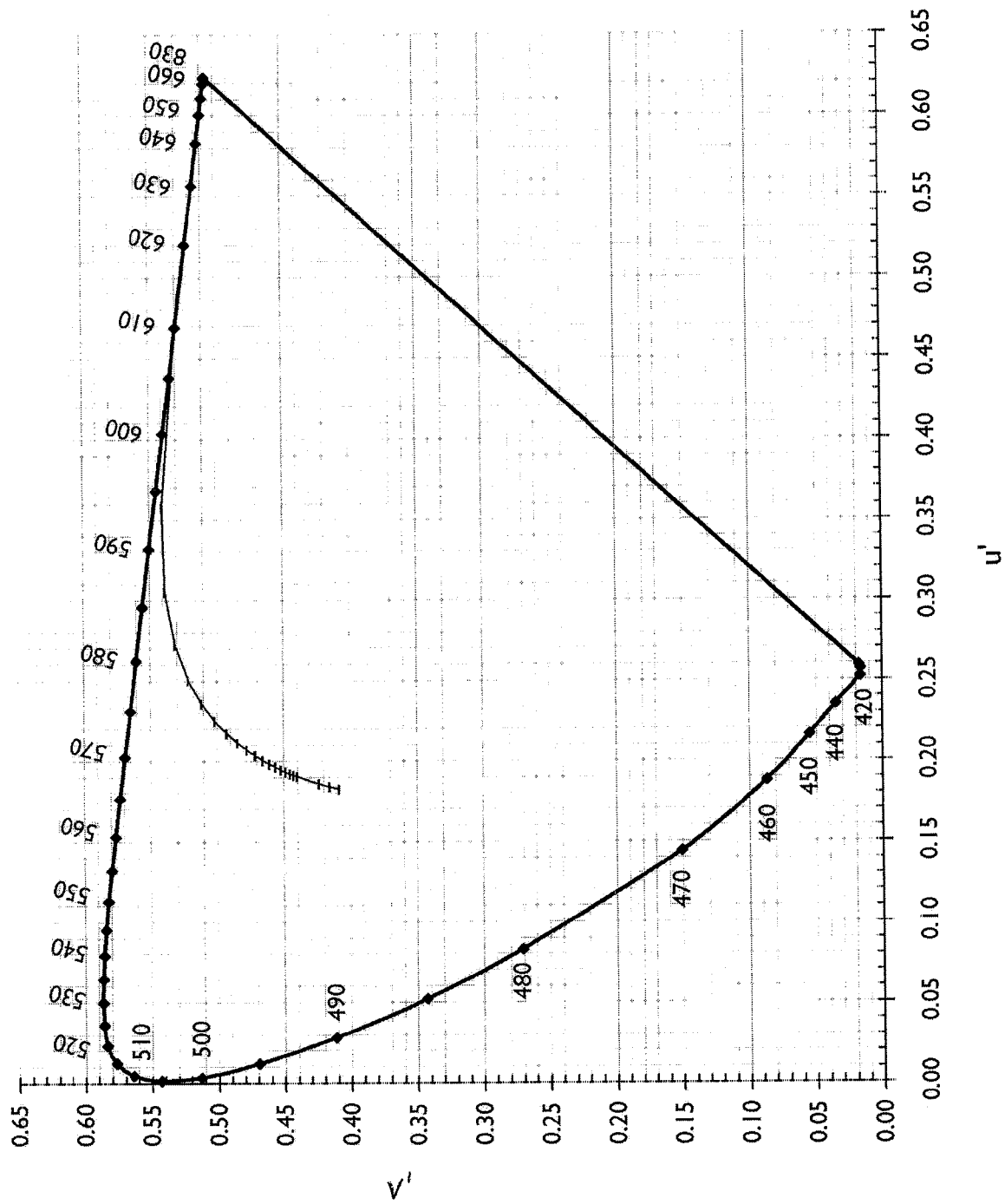

Aspects related to the present invention can be represented on either the 1931 CIE (Commission International de l'Eclairage) Chromaticity Diagram or the 1976 CIE Chromaticity Diagram. FIG. 1 shows the 1931 CIE Chromaticity Diagram. FIG. 2 shows the 1976 Chromaticity Diagram. FIG. 3 shows the 1976 Chromaticity Diagram, including the blackbody locus. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). For a technical description of CIE chromaticity diagrams, see, for example, "Encyclopedia of Physical Science and Technology", vol. 7, 230–231 (Robert A Meyers ed., 1987). The spectral colors are distributed around the edge of the outlined space, which includes all of the hues perceived by the human eye. The boundary line represents maximum saturation for the spectral colors. As noted above, the 1976 CIE Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues which would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2 + \Delta v'^2)^{1/2}$, and the hues defined by a locus of points which are each a common distance from a specified hue consist of hues which would each be perceived as differing from the specified hue to a common extent.

The chromaticity coordinates and the CIE chromaticity diagrams illustrated in FIGS. 1–3 are explained in detail in a number of books and other publications, such as pages 98–107 of K. H. Butler, "Fluorescent Lamp Phosphors" (The Pennsylvania State University Press 1980) and pages 109–110 of G. Blasse et al., "Luminescent Materials" (Springer-Verlag 1994), both incorporated herein by reference.

The chromaticity coordinates (i.e., color points) that lie along the blackbody locus obey Planck's equation: $E(\lambda)=A\lambda^{-5}/(e^{(B/T)}-1)$, where E is the emission intensity, $\lambda$ is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally blueish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

CRI is a relative measurement of how the color rendition of an illumination system compares to that of a blackbody radiator. The CRI equals 100 if the color coordinates of a set of test colors being illuminated by the illumination system are the same as the coordinates of the same test colors being irradiated by the blackbody radiator.

The present invention may be more fully understood with reference to the accompanying drawings and the following detailed description of the invention.

BRIEF DESCRIPTION OF THE DRAWING FIGURES

FIG. 1 shows the 1931 CIE Chromaticity Diagram.
FIG. 2 shows the 1976 Chromaticity Diagram.
FIG. 3 shows the 1976 Chromaticity Diagram, including the blackbody locus.

Figure 4:
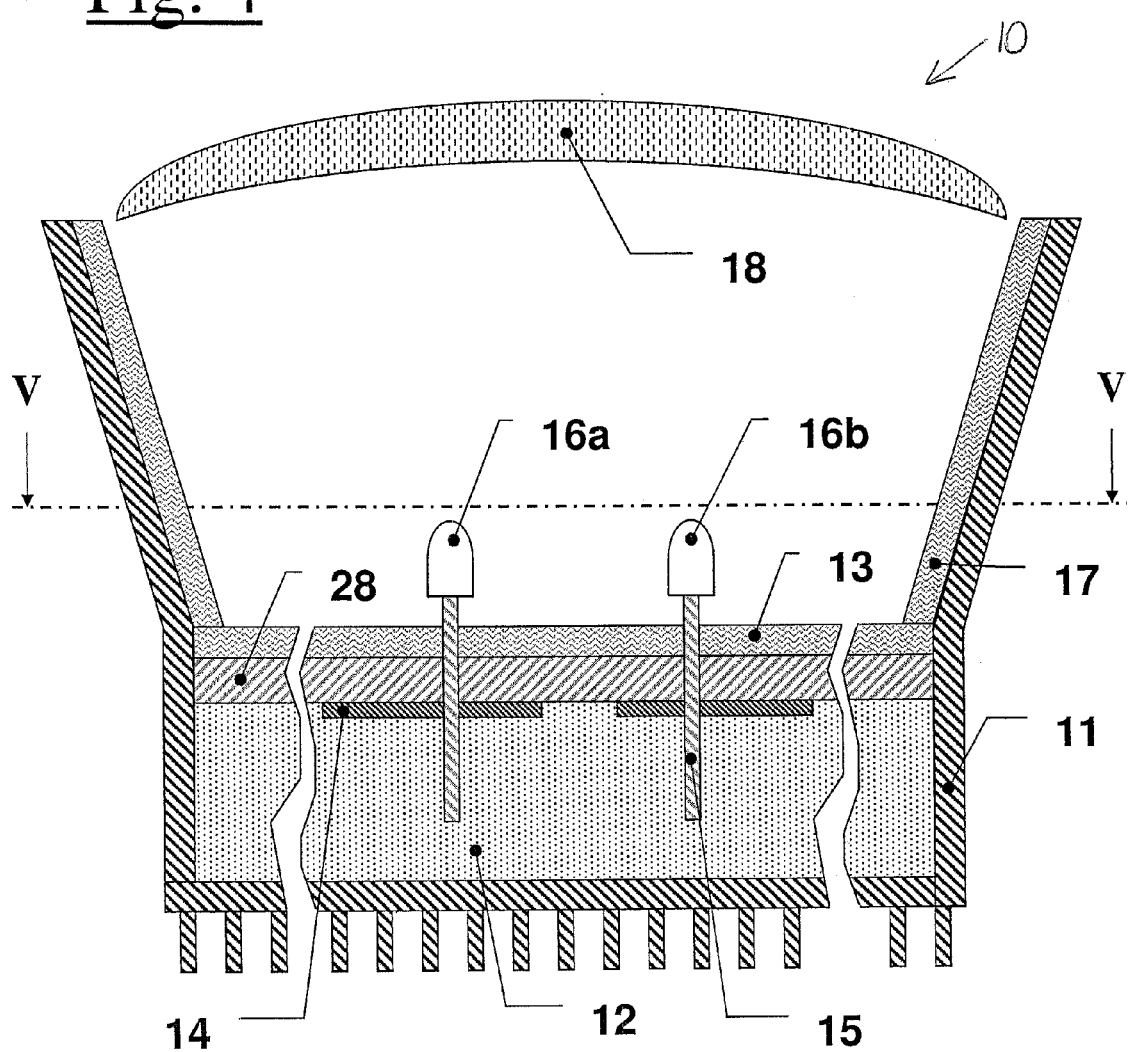
Figure 5:
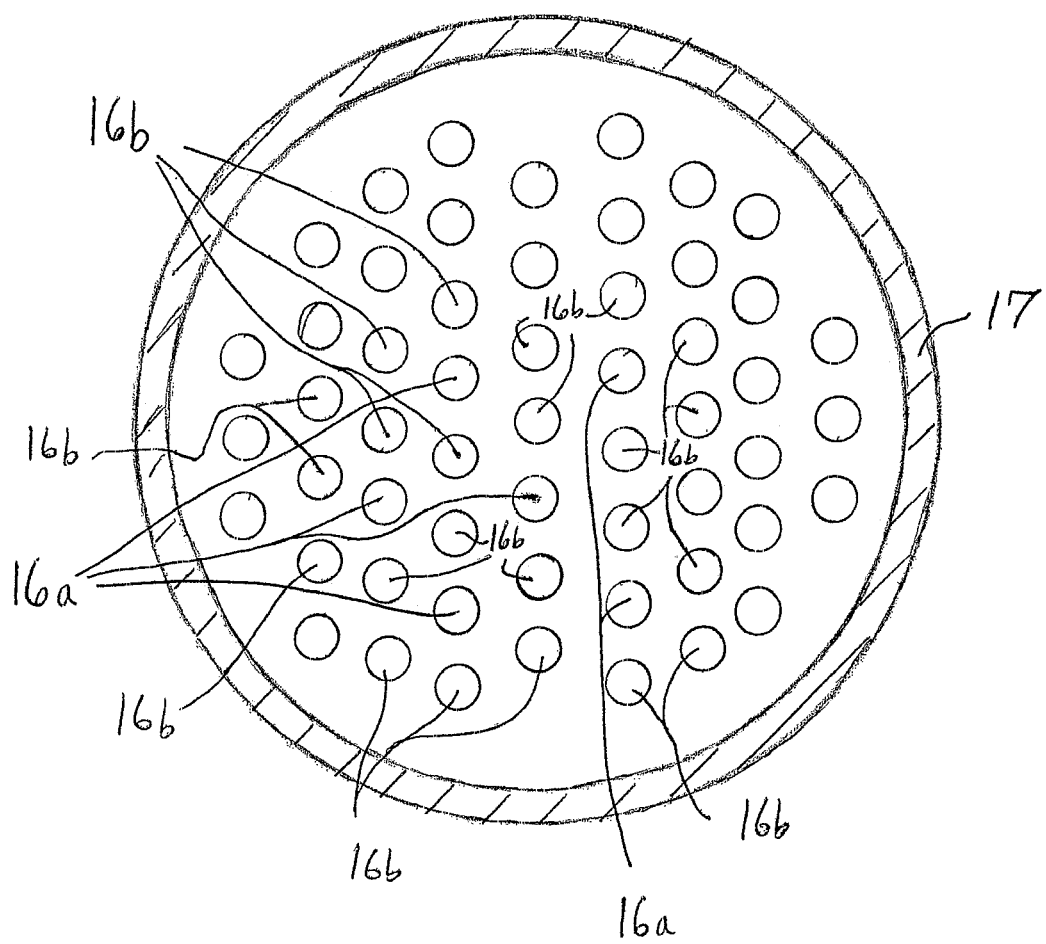
Figure 6:
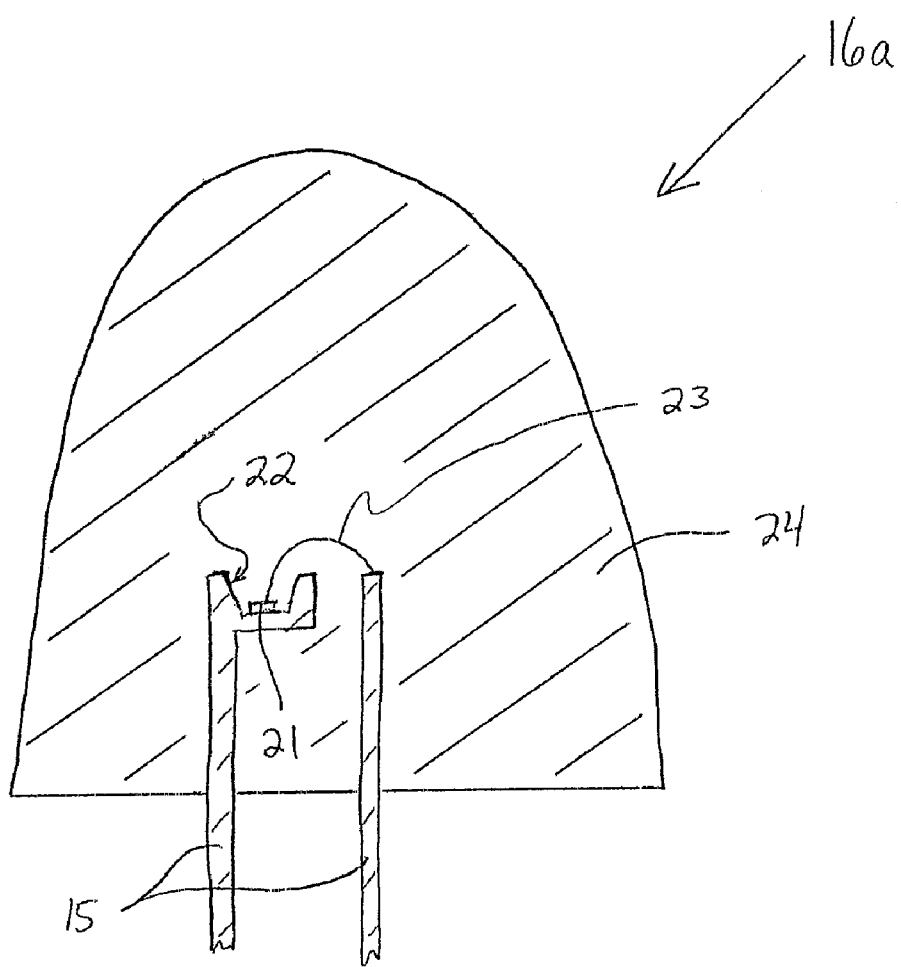
Figure 7:
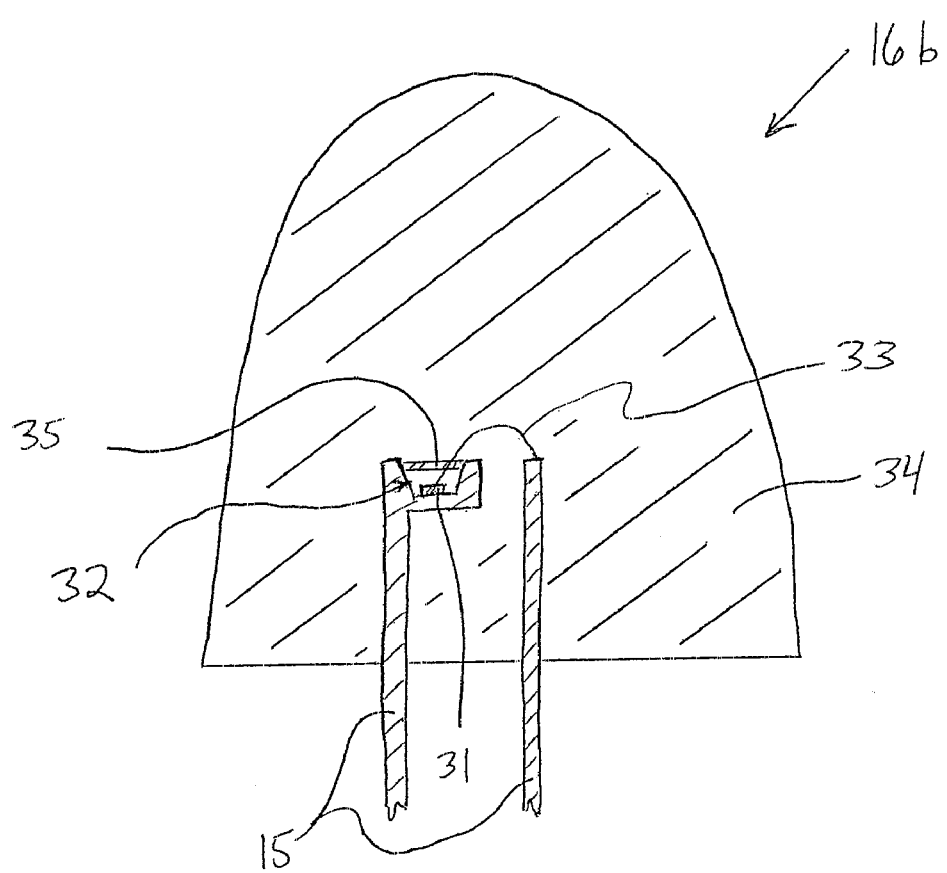
Figure 8:
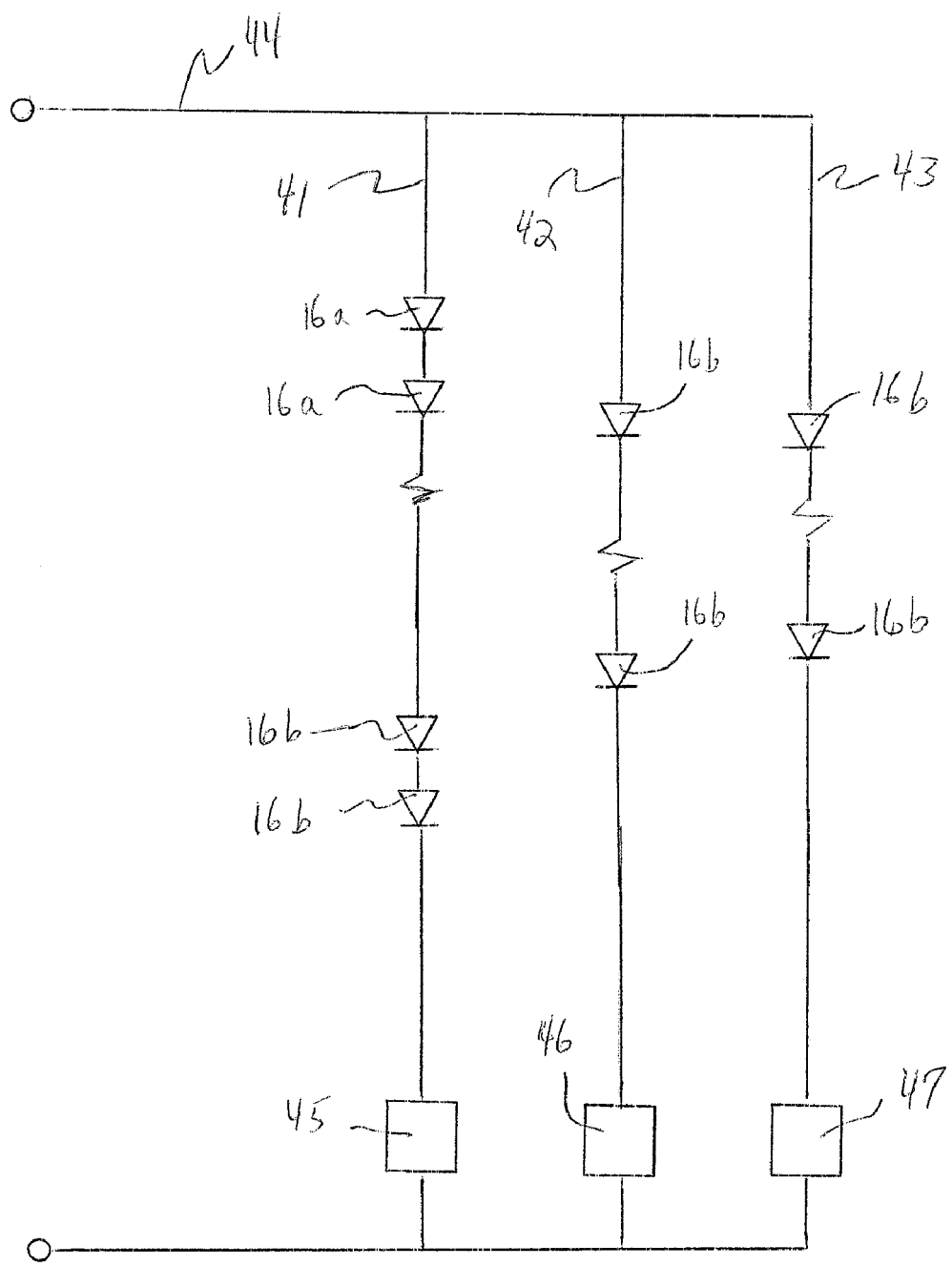
Figure 9:
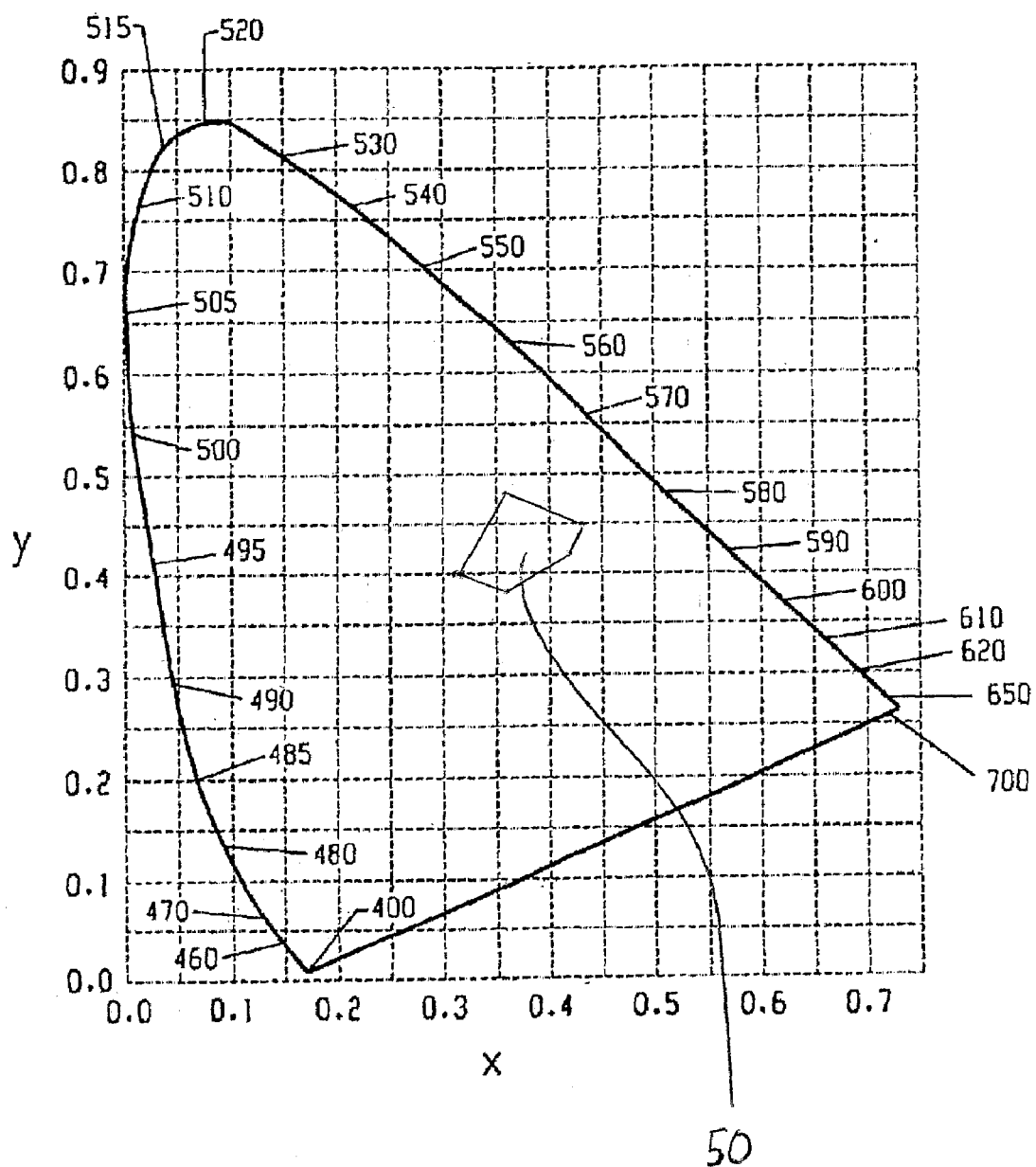

FIG. 4 depicts a first embodiment of a lighting device according to the present invention.
FIG. 5 is a sectional view taken along plane V—V shown in FIG. 4 (and is not drawn to the same scale as FIG. 4).
FIG. 6 is a cross-sectional view of one of the red LEDs 16a employed in the embodiment depicted in FIGS. 4 and 5.
FIG. 7 is a cross-sectional view of one of the greenish-yellowish emitters 16b employed in the embodiment depicted in FIGS. 4 and 5.
FIG. 8 is a schematic electrical diagram of a portion of the circuitry in the device depicted in FIG. 4.
FIG. 9 depicts the first area, as defined herein, on a 1931 CIE Chromaticity Diagram.

DETAILED DESCRIPTION OF THE INVENTION

The expression "430 nm to 480 nm solid state light emitter" means any solid state light emitter which, if illuminated, would emit light having a dominant wavelength in the range of from about 430 nm to about 480 nm.

The expression "555 nm to 585 nm lumiphor" means any lumiphor which, if excited, would emit light having a dominant wavelength in the range of from about 555 nm to about 585 nm.

The expression "600 nm to 630 nm solid state light emitter" means any solid state light emitter which, if illuminated, would emit light having a dominant wavelength in the range of from about 600 nm to about 630 nm.

The term "current", as used in the expression "if current is supplied to the first power line" means electrical current which is sufficient to cause the 430 nm to 480 nm solid state light emitter(s) to emit light having a dominant wavelength in the range of from about 430 nm to about 480 nm, to cause the 555 nm to 585 nm lumiphor(s) to emit light having a dominant wavelength in the range of from about 555 nm to about 585 nm, and/or to cause the 600 nm to 630 nm solid state light emitter(s) to emit light having a dominant wavelength in the range of from about 600 nm to about 630 nm.

The expression "directly or switchably electrically connected" means "directly electrically connected" or "switchably electrically connected."

A statement herein that one or more solid state light emitters are "electrically connected" to a power line means that current can be supplied to the solid state light emitter(s) by supplying current to the power line.

A statement herein that one or more switch is electrically connected to a power line means that current can flow through the power line if the switch (or switches) are closed, and current can be prevented from flowing through the power line if the switch (or one or more of the switches) is open.

A statement herein that two components in a device are "switchably electrically connected" means that there is a switch located between the two components, the switch being selectively closed or opened, wherein if the switch is closed, the two components are electrically connected, and if the switch is open (i.e., during any time period that the switch is open), the two components are not electrically connected.

The expression "illuminated", as used herein when referring to a solid state light emitter, means that at least some current is being supplied to the solid state light emitter to cause the solid state light emitter to emit at least some light.

The expression "excited", as used herein when referring to a lumiphor, means that at least some electromagnetic radiation (e.g., visible light, UV light or infrared light) is contacting the lumiphor, causing the lumiphor to emit at least some light.

The solid state light emitters used in the devices according to the present invention, and the lumiphor (or lumiphors) used in the devices according to the present invention, can be selected from among any solid state light emitters and lumiphors known to persons of skill in the art. Wide varieties of such solid state light emitters and lumiphors are readily obtainable and well known to those of skilled in the art, and any of them can be employed. For example, solid state light emitters and lumiphors which may be used in practicing the present invention are described in:

U.S. Provisional Patent Application No. 60/831,775, filed on Jul. 19, 2006, entitled "Lighting Device" (inventor: Gerald H. Negley), the entirety of which is hereby incorporated by reference;

U.S. Provisional Patent Application No. 60/794,379, filed on Apr. 24, 2006, entitled "Shifting Spectral Content in LEDs by Spatially Separating Lumiphor Films" (inventors: Gerald H. Negley and Antony Paul van de Ven), the entirety of which is hereby incorporated by reference;

U.S. Provisional Patent Application No. 60/808,702, filed on May 26, 2006, entitled "Lighting Device" (inventors: Gerald H. Negley and Antony Paul van de Ven), the entirety of which is hereby incorporated by reference;

U.S. Provisional Patent Application No. 60/802,697, filed on May 23, 2006, entitled "Lighting Device and Method of Making" (inventor: Gerald H. Negley), the entirety of which is hereby incorporated by reference; and U.S. Provisional Patent Application No. 60/839,453, filed on Aug. 23, 2006, entitled "LIGHTING DEVICE AND LIGHTING METHOD" (inventors: Antony Paul van de Ven and Gerald H. Negley), the entirety of which is hereby incorporated by reference.

Examples of types of such solid state light emitters include inorganic light emitting diodes and organic light emitting diodes, a variety of each of which are well-known in the art.

The one or more luminescent materials can be any desired luminescent material. The one or more luminescent materials can be down-converting or up-converting, or can include a combination of both types. For example, the one or more luminescent materials can be selected from among phosphors, scintillators, day glow tapes, inks which glow in the visible spectrum upon illumination with ultraviolet light, etc.

The one or more luminescent materials can be provided in any desired form. For example, the luminescent element can be embedded in a resin (i.e., a polymeric matrix), such as a silicone material or an epoxy.

The one or more lumiphors can individually be any lumiphor, a wide variety of which, as noted above, are known to those skilled in the art. For example, the or each lumiphor can comprise (or can consist essentially of, or can consist of) one or more phosphor. The or each of the one or more lumiphors can, if desired, further comprise (or consist essentially of, or consist of) one or more highly transmissive (e.g., transparent or substantially transparent, or somewhat diffuse) binder, e.g., made of epoxy, silicone, glass or any other suitable material (for example, in any given lumiphor comprising one or more binder, one or more phosphor can be dispersed within the one or more binder). For example, the thicker the lumiphor, in general, the lower the weight percentage of the phosphor can be. Depending on the overall thickness of the lumiphor, however, the weight percentage of the phosphor could be generally any value, e.g., from 0.1 weight percent to 100 weight percent (e.g., a lumiphor formed by subjecting pure phosphor to a hot isostatic pressing procedure).

The or each of the one or more lumiphors can, independently, further comprise any of a number of well-known additives, e.g., diffusers, scatterers, tints, etc.

In some embodiments according to the present invention, one or more of the light emitting diode chips can be included in a package together with one or more of the lumiphors, and the one or more lumiphor in the package can be spaced from the one or more light emitting diode chip in the package to achieve improved light extraction efficiency, as described in U.S. Provisional Patent Application No. 60/753,138, filed on Dec. 22, 2005, entitled "Lighting Device" (inventor: Gerald H. Negley), the entirety of which is hereby incorporated by reference.

In some embodiments according to the present invention, two or more lumiphors can be provided, two or more of the lumiphors being spaced from each other, as described in U.S. Provisional Patent Application No. 60/761,310, filed on Jan. 23, 2006, entitled "Shifting Spectral Content in LEDs by Spatially Separating Lumiphor Films" (inventors: Gerald H. Negley and Antony Van De Ven), the entirety of which is hereby incorporated by reference.

In some embodiments of the present invention, a set of parallel solid state light emitter strings (i.e., two or more strings of solid state light emitters arranged in parallel with each other) is arranged in series with a power line, such that current is supplied through the power line to each of the respective strings of solid state light emitter. The expression "string", as used herein, means that at least two solid state light emitters are electrically connected in series. In some such embodiments, the relative quantities of solid state light emitters in the respective strings differ from one string to the next, e.g., a first string contains a first percentage of 430 nm to 480 nm solid state light emitters and a second string contains a second percentage (different from the first percentage) of 430 nm to 480 nm solid state light emitters. As a representative example, first and second strings each contain solely (i.e., 100%) 430 nm to 480 nm solid state light emitters, and a third string contains 50% 430 nm to 480 nm solid state light emitters and 50% 600 nm to 630 nm solid state light emitters (each of the three strings being electrically connected to a common power line). By doing so, it is possible to easily adjust the relative intensities of the light of the respective wavelengths, and thereby effectively navigate within the CIE Diagram and/or compensate for other changes. For example, the intensity of red light can be increased, when necessary, in order to compensate for any reduction of the intensity of the light generated by the 600 nm to 630 nm solid state light emitters. Thus, for instance, in the representative example described above, by increasing the current supplied to the third power line, or by decreasing the current supplied to the first power line and/or second power line (and/or by interrupting the supply of power to the first power line or the second power line), the x, y coordinates of the mixture of light emitted from the lighting device can be appropriately adjusted.

In some embodiments of the present invention, there are further provided one or more current adjusters directly or switchably electrically connected to one or more of respective strings of solid state light emitters, whereby the current adjuster can be adjusted to adjust the current supplied to one or more of the respective strings of solid state light emitters. In some of such embodiments, the current adjuster is automatically adjusted to maintain the mixture of light within ten MacAdam ellipses of at least one point on the blackbody locus on a 1931 CIE Chromaticity Diagram.

In some embodiments of the present invention, there are further provided one or more switches electrically connected to one or more of the respective strings, whereby the switch selectively switches on and off current to the solid state light emitter(s) on the respective string.

In some embodiments of the present invention, one or more current adjusters and/or one or more switches automatically interrupt and/or adjust current passing through one or more respective strings in response to a detected change in the output from the lighting device (e.g., an extent of deviation from the blackbody locus) or in accordance with a desired pattern (e.g., based on the time of day or night, such as altering the correlated color temperature of the combined emitted light).

In some embodiments of the present invention, there are further provided one or more thermistors which detect temperature and, as temperature changes, cause one or more current adjusters and/or one or more switches to automatically interrupt and/or adjust current passing through one or more respective strings in order to compensate for such temperature change. In general, 600 nm to 630 nm light emitting diodes get dimmer as their temperature increases— in such embodiments, fluctuations in intensity caused by such temperature variation can be compensated for.

In some lighting devices according to the present invention, there are further included one or more circuitry components, e.g., drive electronics for supplying and controlling current passed through at least one of the one or more solid state light emitters in the lighting device. Persons of skill in the art are familiar with a wide variety of ways to supply and control the current passed through solid state light emitters, and any such ways can be employed in the devices of the present invention. For example, such circuitry can include at least one contact, at least one leadframe, at least one current regulator, at least one power control, at least one voltage control, at least one boost, at least one capacitor and/or at least one bridge rectifier, persons of skill in the art being familiar with such components and being readily able to design appropriate circuitry to meet whatever current flow characteristics are desired. For example, circuitry which may be used in practicing the present invention is described in:

U.S. Provisional Patent Application No. 60/809,959, filed on Jun. 1, 2006, entitled "Lighting Device With Cooling" (inventors: Thomas G. Coleman, Gerald H. Negley and Antony Paul van de Ven), the entirety of which is hereby incorporated by reference;

U.S. Provisional Patent Application No. 60/809,595, filed on May 31, 2006, entitled "LIGHTING DEVICE AND METHOD OF LIGHTING" (inventor: Gerald H. Negley), the entirety of which is hereby incorporated by reference; and U.S. Provisional Patent Application No. 60/844,325, filed on Sep. 13, 2006, entitled "BOOST/FLYBACK POWER SUPPLY TOPOLOGY WITH LOW SIDE MOSFET CURRENT CONTROL" (inventor: Peter Jay Myers), the entirety of which is hereby incorporated by reference.

In addition, persons of skill in the art are familiar with a wide variety of mounting structures for many different types of lighting, and any such structures can be used according to the present invention.

For example, fixtures, other mounting structures and complete lighting assemblies which may be used in practicing the present invention are described in:

U.S. Provisional Patent Application No. 60/752,753, filed on Dec. 21, 2005, entitled "Lighting Device" (inventors: Gerald H. Negley, Antony Paul van de Ven and Neal Hunter), the entirety of which is hereby incorporated by reference;

U.S. Provisional Patent Application No. 60/798,446, filed on May 5, 2006, entitled "Lighting Device" (inventor: Antony Paul van de Ven), the entirety of which is hereby incorporated by reference;

U.S. Provisional Patent Application No. 60/845,429, filed on Sep. 18, 2006, entitled "LIGHTING DEVICES, LIGHTING ASSEMBLIES, FIXTURES AND METHODS OF USING SAME" (inventor: Antony Paul van de Ven), the entirety of which is hereby incorporated by reference;

U.S. Provisional Patent Application No. 60/846,222, filed on Sep. 21, 2006, entitled "LIGHTING ASSEMBLIES, METHODS OF INSTALLING SAME, AND METHODS OF REPLACING LIGHTS" (inventors: Antony Paul van de Ven and Gerald H. Negley), the entirety of which is hereby incorporated by reference; and U.S. Provisional Patent Application No. 60/809,618, filed on May 31, 2006, entitled "LIGHTING DEVICE AND METHOD OF LIGHTING" (inventors: Gerald H. Negley, Antony Paul van de Ven and Thomas G. Coleman), the entirety of which is hereby incorporated by reference.

In some lighting devices according to the present invention, there are further included one or more power sources, e.g., one or more batteries and/or solar cells, and/or one or more standard AC power plugs.

The lighting devices according to the present invention can comprise any desired number of solid state light emitters and lumiphors. For example, a lighting device according to the present invention can include 50 or more solid state light emitters, or can include 100 or more solid state light emitters, etc.

The sources of visible light in the lighting devices of the present invention can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present invention. The lighting devices of the present invention can be electrically connected (or selectively connected) to any desired power source, persons of skill in the art being familiar with a variety of such power sources.

The solid state light emitters and lumiphors can be arranged in any desired pattern. In some embodiments according to the present invention, some or all of the 600 nm to 630 nm solid state light emitters are surrounded by five or six 430 nm to 480 nm solid state light emitters (some or all of which may or may not include 555 nm to 585 nm lumiphors), e.g., the 600 nm to 630 nm solid state light emitters and the 430 nm to 480 nm solid state light emitters are arranged in generally laterally arranged rows and spaced from one another substantially evenly, each row being laterally offset from the next adjacent (in a longitudinal direction) row by half the distance between laterally adjacent solid state light emitters, with, in most locations, two 430 nm to 480 nm solid state light emitters being located between each 600 nm to 630 nm solid state light emitter and its nearest neighbor in the same row, and with the 600 nm to 630 nm solid state light emitters in each row being offset from the nearest 600 nm to 630 solid state light emitter(s) in the next adjacent (in a longitudinal direction) row by one and a half times the distance between laterally spaced adjacent solid state light emitters. Alternatively or additionally, in some embodiments according to the present invention, some or all of the brighter solid state light emitters are placed closer to a center of the lighting device than the dimmer solid state light emitters.

The devices according to the present invention can further comprise one or more long-life cooling device (e.g., a fan with an extremely high lifetime). Such long-life cooling device(s) can comprise piezoelectric or magnetorestrictive materials (e.g., MR, GMR, and/or HMR materials) that move air as a "Chinese fan". In cooling the devices according to the present invention, typically only enough air to break the boundary layer is required to induce temperature drops of 10 to 15 degrees C. Hence, in such cases, strong "breezes" or a large fluid flow rate (large CFM) are typically not required (thereby avoiding the need for conventional fans).

The devices according to the present invention can further comprise secondary optics to further change the projected nature of the emitted light. Such secondary optics are well-known to those skilled in the art, and so they do not need to be described in detail herein—any such secondary optics can, if desired, be employed.

The devices according to the present invention can further comprise sensors or charging devices or cameras, etc. For example, persons of skill in the art are familiar with, and have ready access to, devices which detect one or more occurrence (e.g., motion detectors, which detect motion of an object or person), and which, in response to such detection, trigger illumination of a light, activation of a security camera, etc. As a representative example, a device according to the present invention can include a lighting device according to the present invention and a motion sensor, and can be constructed such that (1) while the light is illuminated, if the motion sensor detects movement, a security camera is activated to record visual data at or around the location of the detected motion, or (2) if the motion sensor detects movement, the light is illuminated to light the region near the location of the detected motion and the security camera is activated to record visual data at or around the location of the detected motion, etc.

FIG. 4 depicts a first embodiment of a lighting device in accordance with the present invention.

Referring to FIG. 4, there is shown a lighting device 10 which includes a heat spreading element 11 (formed of aluminum), insulating regions 12 (comprising any desired material which is thermally conductive and not electrically conductive, a wide variety of which are well-known to those skilled in the art, e.g., ceramic, epoxy or silicone optionally filled with silicon carbide, diamond, cubic boron nitride, alumina, etc), a highly reflective surface 13 (formed in situ by polishing the surface of the aluminum heat spreading element, or made of MCPET® (marketed by Furukawa, a Japanese corporation)), conductive traces 14 formed of copper, lead frames 15 formed of silver-plated copper (or silver-plated mild steel), packaged LEDs 16a, 16b (described in more detail below), a reflective cone 17 (made of MCPET®) with a diffuse light scattering surface and a diffusing element 18 (the diffusing element 18 performs a light scattering function).

The thickness of the heat spreading element 11 is about 3.0 mm.

The reflective cone 17 is about 1 mm thick.

The diffusing element 18 is about 3.0 mm thick and is made of glass or plastic with surface features.

The device depicted in FIG. 4 further includes a printed circuit board (PCB) 28 with the conductive traces 14. The PCB is about 1.6 mm thick and is FR4.

Referring to FIG. 8, which is a schematic electrical diagram of a portion of the circuitry in the device depicted in FIG. 4, the lighting device includes a first string 41 of LEDs, a second string 42 of LEDs and a third string 43 of LEDs arranged in parallel with one another and being electrically connected to a common power line 44.

Connected to the first string 41 of LED emitters are a current regulator 45, forty-seven red LEDs 16a (shown in more detail in FIG. 6—only two are depicted in FIG. 8), and twenty-one greenish-yellowish emitters 16b (each including a blue LED and a broad spectrum emitting lumiphor) (shown in more detail in FIG. 7—only two are depicted in FIG. 8).

Connected to the second string 42 of LED emitters are a current regulator 46, zero red LEDs and fifty-one greenish-yellowish emitters 16b (only two are depicted in FIG. 8).

Connected to the third string 43 of LED emitters are a current regulator 47, zero red LEDs and fifty-one greenish-yellowish emitters 16b (only two are depicted in FIG. 8).

The voltage drop across each of the red LEDs 16a is about 2 volts.

The voltage drop across each of the blue LEDs (in the greenish-yellowish emitters 16b) is about 3 volts.

The voltage drop across each of the current regulators is about 7 volts.

The current passing through the first string 41 of LED emitters is regulated to be about 20 milliamps.

The current passing through the second string 42 of LED emitters is regulated to be about 20 milliamps.

The current passing through the third string 43 of LED emitters is regulated to be about 20 milliamps.

The diffusing element 18 is located about two inches from the heat spreading element 11. The diffusing element 18 is attached to a top region of the reflective cone 17. The insulating element 28 is also attached to a bottom region of the reflective cone 17.

The heat spreading element 11 serves to spread out the heat, act as a heat sink, and dissipate the heat from the LEDs. Likewise, the reflective cone 17 functions as a heat sink.

FIG. 5 is a sectional view taken along plane V—V shown in FIG. 4 (and is not drawn to the same scale as FIG. 4).

As shown in FIG. 5, each of the red LEDs 16a is surrounded by five or six greenish-yellowish emitters 16b, i.e., the red LEDs 16a and the greenish-yellowish emitters 16b are arranged in generally laterally arranged rows and spaced from one another substantially evenly, each row being laterally offset from the next adjacent (in a longitudinal direction) row by half the distance between laterally adjacent LEDs, with, in most locations, two greenish-yellowish emitters 16b being located between each red LED 16a and its nearest red LED 16a neighbor in the same row, and with the red LEDs 16a in each row being offset from the nearest red LED(s) 16a in the next adjacent (in a longitudinal direction) row by one and a half times the distance between laterally spaced adjacent LEDs. The spacing between each adjacent LED in each row is about 6 mm.

FIG. 6 is a cross-sectional view of one of the red LEDs 16a employed in the embodiment depicted in FIGS. 4 and 5.

Referring to FIG. 6, each of the red LEDs 16a includes a red light emitting diode chip 21 (from Epistar in Taiwan, measuring 14 mils×14 mils, comprising AlInGaP and having a brightness of not less than 600 mcd), a lead frame 15 having a reflective surface 22, a copper wire 23, and an encapsulant region 24. The reflective surface 22 is made of silver. The encapsulant region 24 is made of Hysol OS 4000. The red LEDs 16a are nearly saturated, i.e., they have a purity of at least 85%, the term "purity" having a well-known meaning to persons skilled in the art, and procedures for calculating purity being well-known to those of skill in the art. The red LEDs 16a emit light having a dominant wavelength in the range of from about 612 nm to about 625 nm.

FIG. 7 is a cross-sectional view of one of the greenish-yellowish emitters 16b employed in the embodiment depicted in FIGS. 4 and 5.

Referring to FIG. 7, each of the greenish-yellowish emitters 16b includes a blue light emitting diode chip 31 (namely, a Cree XT LED (C460XT290) die with a wavelength range of from about 450 nm to about 465 nm, and optical power greater than 24 mW), a lead frame 15 having a reflective surface 32, a copper wire 33, an encapsulant region 34, and a broad spectrum emitting lumiphor 35. The reflective surface 32 is made of silver. The encapsulant region 34 is made of Hysol OS400 or GE/Toshiba Invisil 5332. The lumiphor 35 comprises a luminescent material consisting of QMK58/F-U1 YAG:Ce by Phosphor Teck—UK dispersed in a binder made of Hysol OS400 or GE/Toshiba 5332. The luminescent material is loaded in the binder in an amount in the range of from about 10 to about 12 percent by weight, based on the total weight of the binder and the luminescent material. The luminescent material particles have particle sizes in the range of from about 1.6 micrometers to about 8.6 micrometers, with the mean particle size being in the range of from about 4 micrometers to about 5 micrometers. The lumiphor 35 is spaced from the chip 31 by a distance in the range of from about 100 micrometers to about 750 micrometers (for example, from about 500 micrometers to about 750 micrometers, e.g., about 750 micrometers). The blue chip 31 emits light having a dominant wavelength in the range of from about 450 nm to about 465 nm.

The combined light exiting the LED 16b (i.e., a mixture of (1) light including light emitted by the blue chip 31 which passes through the lumiphor and exits the LED 16b and (2) light emitted by the luminescent material upon being excited by light emitted from the blue chip 31 which exits the LED 16b), corresponds to a point on the 1931 CIE Chromaticity Diagram having x, y color coordinates which are within the first area on a 1931 CIE Chromaticity Diagram, i.e., an area enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38, specific examples including a point having x, y color coordinates of 0.3706, 0.4370 for 2850 K light, and 0.3550, 0.4089 for 3400 K light.

The combined light exiting the lighting device 10, i.e., a combination of (1) light exiting the lighting device 10 which was emitted by the first group of solid state light emitters 16b, (2) light exiting the lighting device 10 which was emitted by the first group of lumiphors 35, and (3) light exiting the lighting device 10 which was emitted by the second group of solid state light emitters 16a corresponds to a point on a 1931 CIE Chromaticity Diagram which is within ten MacAdam ellipses of at least one point on the blackbody locus on a 1931 CIE Chromaticity Diagram.

For indoor residential illumination a color temperature of 2700 k to 3300 k is normally preferred, and for outdoor flood lighting of colorful scenes a color temperature approximating daylight 5000K (4500–6500K) is preferred.

FIG. 9 depicts the first area 50 on a 1931 CIE Chromaticity Diagram, i.e., an area enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

Any two or more structural parts of the lighting devices described herein can be integrated. Any structural part of the lighting devices described herein can be provided in two or more parts (which can be held together, if necessary).

The invention claimed is:

1. A lighting device comprising:
   a first group of solid state light emitters, said first group of solid state light emitters including at least one solid state light emitter;
   a first group of lumiphors, said first group of lumiphors including at least one lumiphor;
   a second group of solid state light emitters, said second group of solid state light emitters including at least one solid state light emitter; and
   at least a first power line, each of said first group of solid state light emitters and each of said second group of solid state light emitters being electrically connected to said first power line,
   wherein:
   each of said first group of solid state light emitters, if illuminated, would emit light having a dominant wavelength in the range of from 430 nm to 480 nm;
   each of said first group of lumiphors, if excited, would emit light having a dominant wavelength in the range of from about 555 nm to about 585 nm;
   each of said second group of solid state light emitters, if illuminated, would emit light having a dominant wavelength in the range of from 600 nm to 630 nm;
   if current is supplied to said first power line:
      a combination of (1) light exiting said lighting device which was emitted by said first group of solid state light emitters, (2) light exiting said lighting device which was emitted by said first group of lumiphors, and (3) light exiting said lighting device which was emitted by said second group of solid state light emitters would, in an absence of any additional light, produce a mixture of light having x, y coordinates on a 1931 CIE Chromaticity Diagram which define a point which is within ten MacAdam ellipses of at least one point on the blackbody locus on a 1931 CIE Chromaticity Diagram, and
      a combination of (1) light exiting said lighting device which was emitted by said first group of solid state light emitters, and (2) light exiting said lighting device which was emitted by said first group of lumiphors would, in an absence of any additional light, produce a sub-mixture of light having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

2. A lighting device as recited in claim 1, wherein:
said first group of solid state light emitters comprises a plurality of first LEDs; and
said second group of solid state light emitters comprises a plurality of second LEDs.

3. A lighting device as recited in claim 1, further comprising at least one switch electrically connected to said first power line, said switch selectively switching on and off current to said first power line.

4. A lighting device as recited in claim 1, wherein said sub-mixture illumination has x, y color coordinates which define a point which is within an area on a 1931 CIE Chromaticity Diagram enclosed by first, second, third and fourth line segments, said first line segment connecting a first point to a second point, said second line segment connecting said second point to a third point, said third line segment connecting said third point to a fourth point, said fourth line segment connecting said fourth point to said first point, said first point having x, y coordinates of 0.32, 0.40, said second point having x, y coordinates of 0.36, 0.48, said third point having x, y coordinates of 0.41, 0.455, and said fourth point having x, y coordinates of 0.36, 0.38.

5. A lighting device as recited in claim 1, wherein:
said first group of solid state light emitters comprises at least five light emitting diodes; and
said first group of lumiphors comprises at least five lumiphors.

6. A lighting device as recited in claim 1, wherein if all of said solid state light emitters in said first group of solid state light emitters are illuminated, at least one of said lumiphors in said first group of lumiphors would be excited by light emitted from said first group of solid state light emitters.

7. A lighting device as recited in claim 1, wherein if all of said solid state light emitters in said first group of solid state light emitters are illuminated, all of said lumiphors in said first group of lumiphors would be excited by light emitted from said first group of solid state light emitters.

8. A lighting device as recited in claim 1, wherein at least one of said solid state light emitters in said first group of solid state light emitters is embedded within an encapsulant element in which at least one of said first group of lumiphors is also embedded.

9. A lighting device as recited in claim 1, wherein said mixture of light would have a CRI of at least 80.

10. A lighting device as recited in claim 1, wherein said lighting device has an efficacy of at least 25 lumens per watt.

11. An enclosure, comprising an enclosed space and at least one lighting device as recited in claim 1, wherein if current is supplied to said first power line, said lighting device would illuminate at least a portion of said enclosed space.

12. A structure comprising a surface and at least one lighting device as recited in claim 1, wherein if current is supplied to said first power line, said lighting device would illuminate at least a portion of said surface.

13. An area, comprising at least one item selected from among the group consisting of a swimming pool, a room, a warehouse, an indicator, a road, a vehicle, a road sign, a billboard, a ship, a boat, an aircraft, a stadium, a tree, a window, and a lamppost, having mounted therein or thereon at least one lighting device as recited in claim 1.

14. A lighting device as recited in claim 1, wherein:
said lighting device comprises at least a first set of parallel LED strings, said first set of parallel LED strings comprising at least a first LED string and a second LED string, said first set of parallel LED strings being arranged in series relative to said first power line,
a first ratio differs from a second ratio,
said first ratio being equal to (1) a number of LEDs in said second group of solid state light emitters and in said first LED string, divided by (2) a number of LEDs in said first group of solid state light emitters and in said first LED string;
said second ratio being equal to (3) a number of LEDs in said second group of solid state light emitters and in said second LED string, divided by (4) a number of LEDs in said first group of solid state light emitters and in said second LED string.

15. A lighting device as recited in claim 14, further comprising at least one current adjuster directly or switchably electrically connected to one of said first and second LED strings, said current adjuster, if adjusted, adjusting the current supplied to said one of said first and second LED strings.

16. A lighting device as recited in claim 15, wherein said current adjuster is automatically adjusted to maintain said mixture of light within ten MacAdam ellipses of at least one point on the blackbody locus on a 1931 CIE Chromaticity Diagram.

17. A lighting device as recited in claim 1, wherein:
each of said first group of solid state light emitters, if illuminated, would emit light having a dominant wavelength in the range of from 440 nm to 480 nm;
each of said first group of lumiphors, if excited, would emit light having a dominant wavelength in the range of from about 560 nm to about 580 nm; and
each of said second group of solid state light emitters, if illuminated, would emit light having a dominant wavelength in the range of from 605 nm to 630 nm.

18. A method of lighting comprising:
illuminating a first group of solid state light emitters, said first group of solid state light emitters including at least a first solid state light emitter, such that each of said first group of solid state light emitters emits light having a dominant wavelength in the range of from 430 nm to 480 nm;
illuminating a second group of solid state light emitters, said second group of solid state light emitters including at least one solid state light emitter, such that each of said second group of solid state light emitters emits light having a dominant wavelength in the range of from 600 nm to 630 nm
exciting a first group of lumiphors, said first group of lumiphors including at least one lumiphor, such that each of said first group of lumiphors emits light having a dominant wavelength in the range of from about 555 nm to about 585 nm;

wherein:

a combination of (1) light exiting said lighting device which was emitted by said first group of solid state light emitters, (2) light exiting said lighting device which was emitted by said first group of lumiphors, and (3) light exiting said lighting device which was emitted by said second group of solid state light emitters produces a mixture of light having x, y coordinates on a 1931 CIE Chromaticity Diagram which define a point which is within ten MacAdam ellipses of at least one point on the blackbody locus on a 1931 CIE Chromaticity Diagram, and a combination of (1) light exiting said lighting device which was emitted by said first group of solid state light emitters, and (2) light exiting said lighting device which was emitted by said first group of lumiphors would, in an absence of any additional light, produce a sub-mixture of light having x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

19. A method as recited in claim 18, wherein:

said first group of solid state light emitters and said second group of solid state light emitters are electrically connected to a first power line; and said first group of solid state light emitters and said second group of solid state light emitters are illuminated by supplying current to said first power line.

20. A method as recited in claim 19, wherein said first group of lumiphors are excited by light emitted by said first group of solid state light emitters.

* * * * *

UNITED STATES PATENT AND TRADEMARK OFFICE
CERTIFICATE OF CORRECTION

Page 1 of 1

| PATENT NO. | : 7,213,940 B1 |
| APPLICATION NO. | : 11/566440 |
| DATED | : May 8, 2007 |
| INVENTOR(S) | : Antony Paul Van De Ven and Gerald H. Negley |

It is certified that error appears in the above-identified patent and that said Letters Patent is hereby corrected as shown below:

On the Title Page

*Item (75), Inventors*:

please change "Antony Paul Van De Ven, Hong Hong" to

--Antony Paul Van De Ven, Hong Kong--

Column 8
  *Lines 51-52*: please delete the paragraph beginning with "at least a first" and ending with "light emitters and each"

Signed and Sealed this
Eighth Day of March, 2011

David J. Kappos
*Director of the United States Patent and Trademark Office*